(12) United States Patent
Kim

(10) Patent No.: US 8,497,494 B2
(45) Date of Patent: Jul. 30, 2013

(54) THIN FILM TRANSISTOR AND ARRAY SUBSTRATE FOR LIQUID CRYSTAL DISPLAY DEVICE COMPRISING ORGANIC INSULATING MATERIAL

(75) Inventor: Dae-Won Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 609 days.

(21) Appl. No.: 11/798,297

(22) Filed: May 11, 2007

(65) Prior Publication Data

US 2008/0121875 A1    May 29, 2008

(30) Foreign Application Priority Data

Nov. 24, 2006 (KR) .......................... 10-2006-0116984
Apr. 25, 2007 (KR) .......................... 10-2007-0040149

(51) Int. Cl.
*H01L 51/05* (2006.01)
*H01L 51/10* (2006.01)

(52) U.S. Cl.
USPC .............. 257/40; 257/E51.007; 257/E27.117; 438/161

(58) Field of Classification Search
USPC .............. 257/40, E51.007, E27.117; 438/161
See application file for complete search history.

(56) References Cited

U.S. PATENT DOCUMENTS

| | | | |
|---|---|---|---|
| 5,843,833 A * | 12/1998 | Ohtani et al. | 438/486 |
| 6,636,280 B1 * | 10/2003 | Miyazawa et al. | 349/43 |
| 6,859,193 B1 * | 2/2005 | Yumoto | 345/82 |
| 2002/0086470 A1 * | 7/2002 | Kim et al. | 438/166 |
| 2004/0257487 A1 * | 12/2004 | Lee et al. | 349/43 |
| 2005/0026317 A1 * | 2/2005 | Sirringhaus et al. | 438/21 |
| 2005/0130443 A1 * | 6/2005 | Meth et al. | 438/780 |
| 2006/0054884 A1 * | 3/2006 | Maeda et al. | 257/40 |
| 2006/0108581 A1 * | 5/2006 | Ahn et al. | 257/40 |
| 2006/0255335 A1 * | 11/2006 | Nishikawa et al. | 257/40 |
| 2007/0145371 A1 * | 6/2007 | Wu et al. | 257/66 |
| 2007/0249122 A1 * | 10/2007 | Seo et al. | 438/264 |
| 2008/0087886 A1 * | 4/2008 | Yang | 257/40 |
| 2008/0283833 A1 * | 11/2008 | Kim et al. | 257/59 |

FOREIGN PATENT DOCUMENTS

| | | | |
|---|---|---|---|
| JP | 61078166 A | * | 4/1986 |
| JP | 2004241528 A | * | 8/2004 |
| KR | 10-2006-035597 | | 4/2006 |
| KR | 10-2006-036247 | | 4/2006 |
| KR | 10-2006-038241 | | 4/2006 |

OTHER PUBLICATIONS

Machine English translation of JP2004-241528A.*

* cited by examiner

*Primary Examiner* — Matthew Reames
*Assistant Examiner* — Christopher M Roland
(74) *Attorney, Agent, or Firm* — Morgan, Lewis & Bockius LLP

(57) ABSTRACT

An organic thin film transistor includes source and drain electrodes spaced apart from each other on a substrate, an organic semiconductor layer between the source and drain electrodes on the substrate, a gate insulating layer including an organic insulating material on the organic semiconductor layer, the gate insulating layer having a thickness of about 1,800 Å to about 2,500 Å, and a gate electrode on the gate insulating layer.

4 Claims, 8 Drawing Sheets

THIN FILM TRANSISTOR AND ARRAY SUBSTRATE FOR LIQUID CRYSTAL DISPLAY DEVICE COMPRISING ORGANIC INSULATING MATERIAL

The present invention claims the benefit of Korean Patent Application No. 10-2006-0116984 filed on Nov. 24, 2006 and Korean Patent Application No. 10-2007-0040149 filed on Apr. 25, 2007, which are hereby incorporated by reference in their entirety.

BACKGROUND OF THE INVENTION

1. Field of the Invention

Embodiments of the present invention relate to a liquid crystal display device (LCD), and more particularly, to an array substrate for the LCD including an organic thin film transistor (TFT) and a method of fabricating the same.

2. Discussion of the Related Art

Generally, an LCD device uses optical anisotropy and polarization properties of liquid crystal molecules to display an image. The liquid crystal molecules have an alignment direction along their lateral and bilateral axes. The alignment direction of the liquid crystal molecules can be controlled by applying an electric field to the liquid crystal molecules. In other words, as the intensity of the electric field is changed, the orientation of the alignment direction for the liquid crystal molecules also changes. Since incident light through liquid crystal molecules is refracted based on the orientation of the liquid crystal molecules, due to the optical anisotropy of the aligned liquid crystal molecules, intensity of the transmitted light can be controlled such that images can be displayed. Among the various types of LCD devices commonly used, active matrix LCD (AM-LCD) devices having thin film transistors (TFTs) with pixel electrodes connected to the TFTs disposed in matrix form have high resolution and superiority in displaying moving images.

FIG. 1 is a schematic perspective view of an AM-LCD according to the related art. As shown in FIG. 1, an LCD device includes an array substrate 10 and a color filter substrate 20 facing each other and a liquid crystal molecules 30 between the array substrate 10 and the color filter substrate 20. The array substrate 10 includes a first transparent substrate 12, a plurality of gate lines 14 and a plurality of data lines 16 crossing each other and define a plurality of pixel regions "P." With respect to one pixel region "P," a thin film transistor (TFT) "Tr" is formed at a crossing of one of the plurality of gate lines 14 and one of the plurality of data lines 16. A pixel electrode 18 is formed in the pixel region "P" and is connected to the thin film transistor "Tr." The color filter substrate 20 includes a second transparent substrate 22, a black matrix 25, a color filter layer 26, and a common electrode 28. The black matrix 25 has a lattice shape to shield a non-pixel region (not shown) such as the regions corresponding to the gate and data lines 14 and 16 and the TFT "Tr." The color filter layer 26 includes red, green and blue sub-color filters 26a, 26b and 26c. Each of the red, green and blue sub-color filters 26a, 26b and 26c is disposed in the pixel regions "P."

Although not shown, a seal pattern is formed using a sealant to prevent leakage of the liquid crystal molecules 30 at a periphery of a display region (not shown) of the LCD, and a first orientation film is positioned between the common electrode 28 and the layer of liquid crystal molecules 30, and a second orientation film is positioned between the pixel electrode 18 and the liquid crystal layer 30 within the region of the seal pattern to control initial alignment of the liquid crystal molecules. Further, at least one polarizer, which transmits light parallel to polarization axis, may be attached on at least one outer side of the array substrate and the color filter substrate, and a backlight unit is disposed under the one polarizer as a light source.

On/off signals of the TFT "Tr" are sequentially applied to the gate line 14, and then an image signal of the data line 16 is transmitted to the pixel electrode 18 with respect to a selected pixel region "P." Next, the liquid crystal molecules are driven by a vertical electric field, thereby displaying various image in accordance with change of optical transmittance.

The first and second transparent substrates 12 and 22 are conventionally made of glass. However, as a small-size portable device such as notebook or a personal digital assistant (PDA) has been widely utilized, plastic has been suggested as a plastic substrate because the plastic is lighter, slimmer and more flexible than the glass. The array substrate for an LCD including the TFT is typically manufactured under the high temperature process more than 200 degrees Celsius. However, the plastic substrate cannot be manufactured under a high temperature process of more than 200 degrees Celsius because the plastic substrate is weak against heat and chemical treatment.

To solve these problems, TFTs are formed using an organic semiconductor material under a low-temperature of less than 200 degrees Celsius. In this low-temperature process, the step of forming TFTs may be performed using a coating apparatus that is more inexpensive than a depositing apparatus, thereby reducing process costs. However, glass may be utilized for the array substrate using the organic semiconductor material as well as the plastic substrate. Hereinafter, the method of fabricating the array substrate using the organic semiconductor material at a low-temperature will be explained.

When the array substrate is formed under the low-temperature process of less than 200 degrees Celsius, the electrodes and the lines, including a metallic material, and the passivation layer, including an insulating material, do not substantially affect the electrical characteristics of the TFT, regardless the temperature condition. However, in case of the semiconductor layer including a channel as a moving path of carriers, an amorphous silicon is formed under the low-temperature of less than 200 degrees Celsius, the inner crystal structure of the semiconductor layer is not substantially organized. Therefore, the mobility of the TFT may be hampered. Accordingly, a semiconductor layer of organic semiconductor material is suggested instead of amorphous silicon to solve the mobility problem. However, the organic semiconductor material that is formed by a coating method may be weak against development solution or etchant solution. Therefore, the electrical characteristics of the organic TFT may deteriorate when the organic semiconductor layer is exposed during a developing or coating process.

Accordingly, a top-gate type organic TFT is currently suggested because the organic semiconductor layer, the gate insulating layer and the gate electrode can be simultaneously patterned in the top-gate type organic TFT. In the case of either the top-gate type organic TFT or the bottom-gate type organic TFT, the thickness of the gate insulating layer affects the electrical characteristics of the organic TFT. For example, when the gate insulating layer is formed a thickness of less than 1,000 Å, there is a dielectric breakdown phenomenon that can occur in which the gate insulating layer is ruptured due to the subsequent processing. On the other hand, when the gate insulating layer is formed with an excessive thick thickness, the electrical characteristics of the organic TFT may deteriorate.

SUMMARY OF THE INVENTION

Accordingly, embodiments of the present invention are directed to an array substrate of an LCD and a method of fabricating the same that substantially obviate one or more of the problems due to limitations and disadvantages of the related art.

An object of the present invention is to provide an array substrate for an LCD and a method of fabricating the same that can provide a gate insulating layer while preventing gate insulating dielectric breakdown.

Another object of the present invention is to provide an array substrate for an LCD and a method of fabricating the same that can provide an organic TFT having more stable electrical characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic thin film transistor includes source and drain electrodes spaced apart from each other on a substrate, an organic semiconductor layer between the source and drain electrodes on the substrate, a gate insulating layer including an organic insulating material on the organic semiconductor layer, the gate insulating layer having a thickness of about 1,800 Å to about 2,500 Å, and a gate electrode on the gate insulating layer.

In another embodiment, an organic thin film transistor includes a gate electrode on a substrate, a gate insulating layer on the gate electrode, the gate insulating layer including an organic insulating material and having a thickness of about 1,800 Å to about 2,500 Å, an organic semiconductor layer on the gate insulating layer, and source and drain electrodes spaced apart from each other and contacting the organic semiconductor layer.

In another embodiment, a method of fabricating an organic thin film transistor includes forming source and drain electrodes spaced apart from each other on a substrate, forming an organic semiconductor layer between the source and drain electrodes on the substrate, forming a gate insulating layer on the organic semiconductor layer, the gate insulating layer including an organic insulating material and having a thickness of about 1,800 Å to about 2,500 Å, and forming a gate electrode on the gate insulating layer.

In a further embodiment, an array substrate for an liquid crystal display device including an organic thin film transistor includes a data line on a substrate along a first direction, a source electrode connected to the data line, and a drain electrode spaced apart from a source electrode, an organic semiconductor layer between the source and drain electrodes on the substrate, gate insulating layer on the organic semiconductor layer, the gate insulating layer including an organic insulating material and having a thickness of about 1,800 Å to about 2,500 Å, a gate electrode on the gate insulating layer, a pixel electrode on the substrate, the pixel electrode contacting an end portion of the drain electrode, a passivation layer on the gate electrode, the passivation layer having a contact hole that exposes a portion of the gate electrode and an opening that exposes the pixel electrode, and a gate line on the passivation layer along a second direction crossing the first direction, the gate line connected to the gate electrode via the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
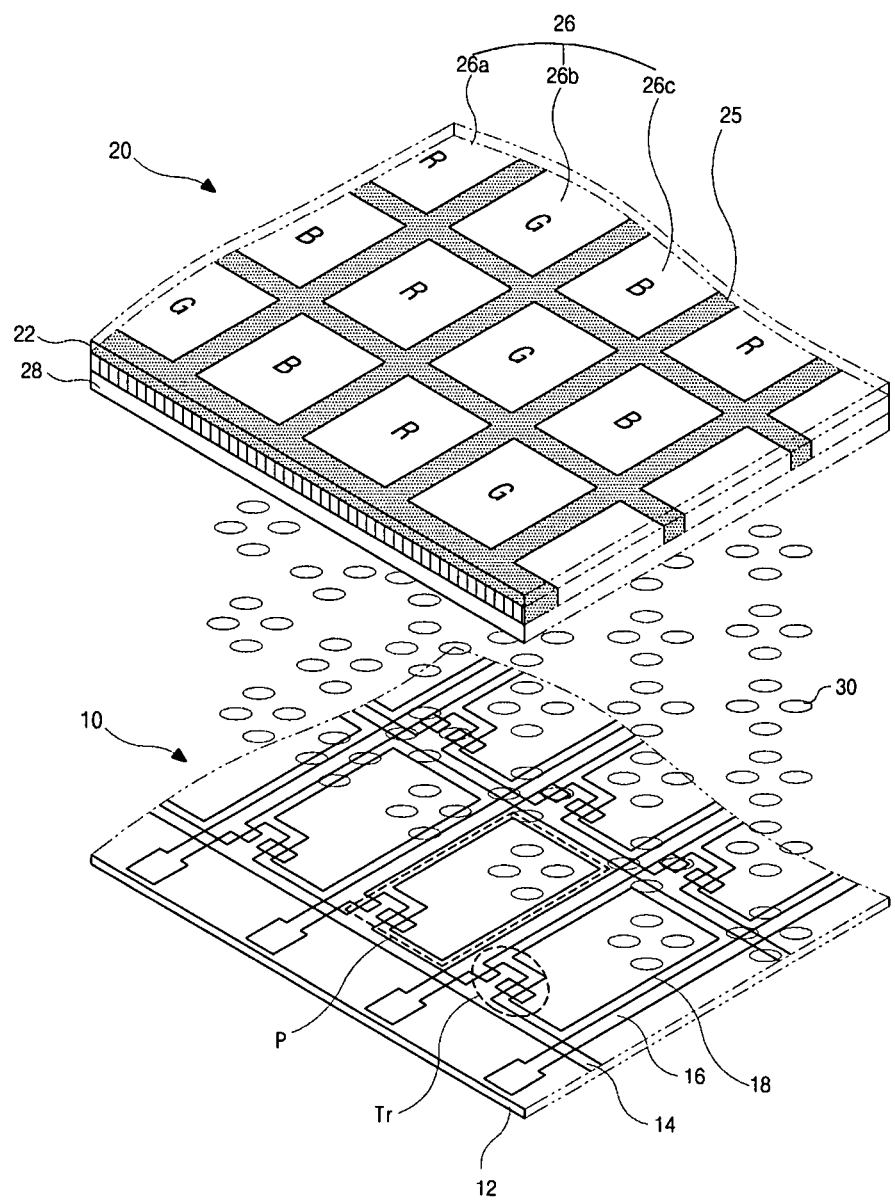
FIG. 1 is a schematic perspective view of an AM-LCD according to the related art.
Figure 2:
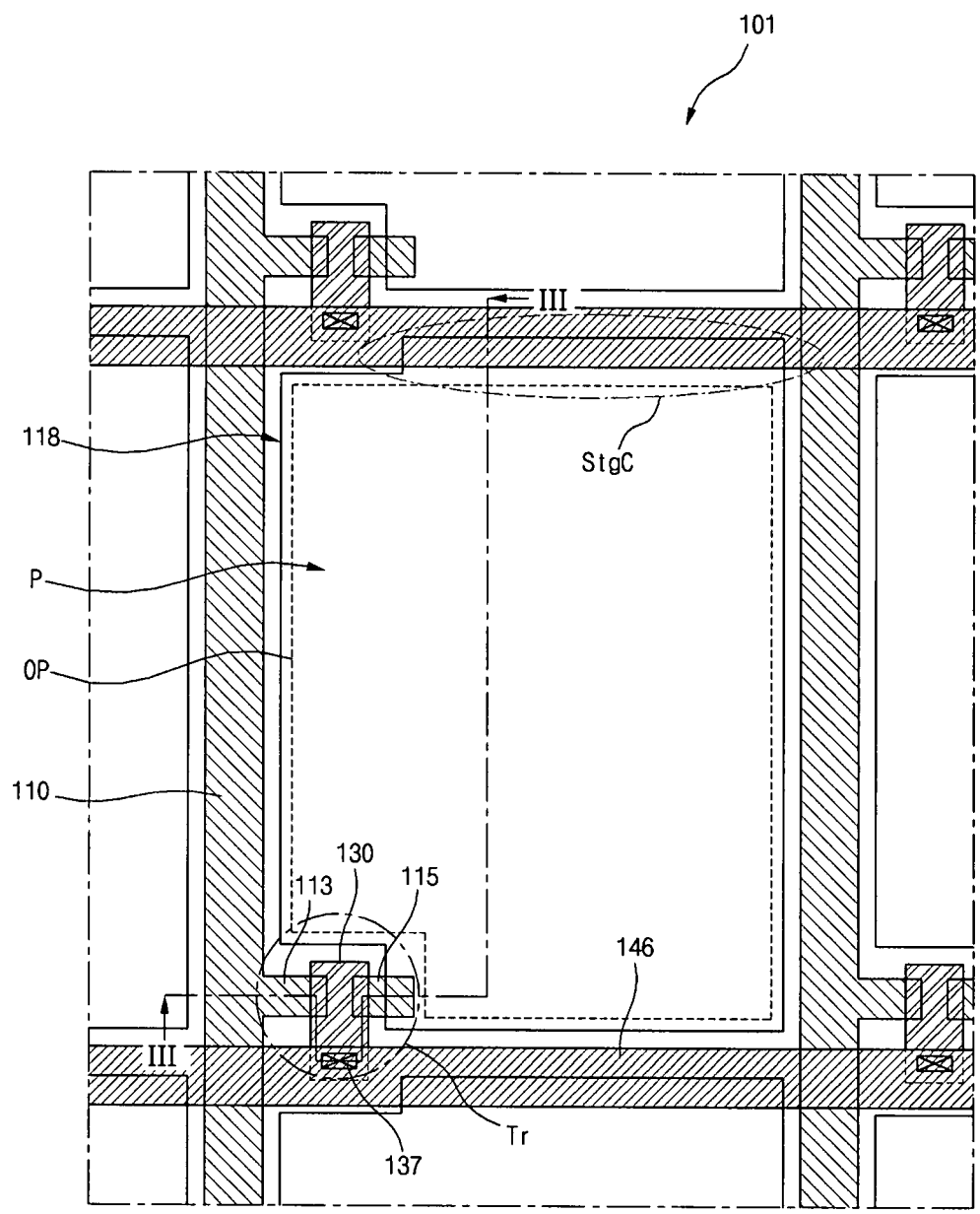
FIG. 2 is a schematic plan view showing an array substrate for an LCD including a top-gate type organic TFT according to an embodiment of the present invention.
Figure 3:
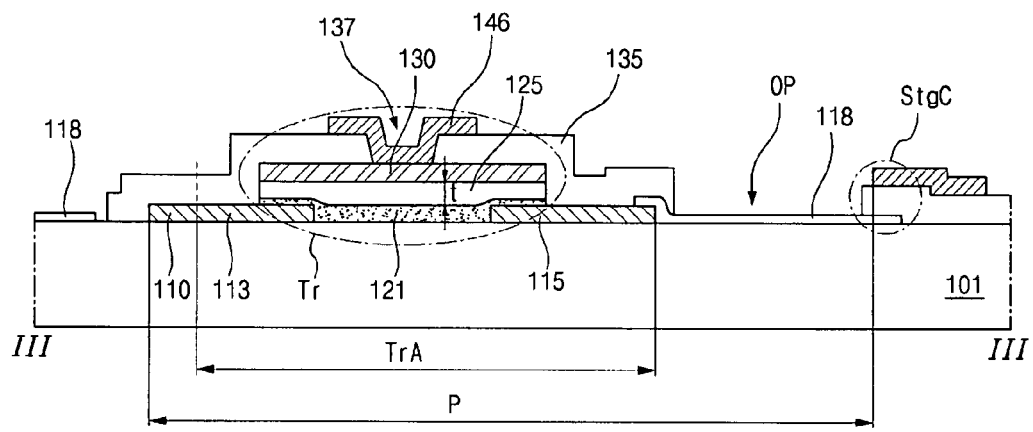
FIG. 3 is a schematic cross-sectional view taken along line III-III' of FIG. 2 for showing a cross-sectional structure of a storage capacitor and the top-gate type organic TFT.

FIG. 2 is a schematic plan view showing an array substrate for an LCD including a top-gate type organic TFT according to an embodiment of the present invention, and FIG. 3 is a schematic cross-sectional view taken along line III-III' of FIG. 2 for showing a cross-sectional structure of a storage capacitor and the top-gate type organic TFT.

For convenience sake, a first region in which the organic TFT is formed is defined as a switching region "TrA" and a second region in which the storage capacitor "StgC" is formed is defined as a storage region "StgA." The first and second regions are disposed in a pixel region "P."

As shown in FIG. 2, a gate line 146 is formed along a first direction on a substrate 101, and a data line 110 is formed along a second direction crossing the first direction to define a pixel region "P." A source electrode 113 extends from the data line 110, a drain electrode 115 is formed to be spaced apart from the source electrode 113, and a gate electrode 130 is connected to the gate line 146 and covers a gap space between the source and drain electrodes 113 and 115. Although not shown, a semiconductor layer (not shown) of an organic semiconductor material and a gate insulating layer (not shown) are formed under the gate electrode 130. Further, a pixel electrode 118 is directly connected to the drain electrode 115 in the pixel region "P" by contacting an end portion of the drain electrode 115. A first portion of the pixel electrode 118 overlaps the previous gate line 146 so that the first portion of the pixel electrode 118 and a second portion of the previous gate line 146 overlapped by the first portion of the pixel electrode 118 act as first and second storage electrodes, respectively. The first and second storage electrodes and an insulating layer therebetween constitute a storage capacitor "StgC."

In FIG. 3, the data line 110, the source electrode 113, and the drain electrode 115 are formed on the substrate 101. Here, the source and drain electrodes 113 and 115 are disposed in the switching region "TrA." The pixel electrode 118 is formed on the substrate 101 and contacts the end portion of the drain electrode. The pixel electrode 118 may include a transparent conductive material, such as indium tin oxide (ITO) or indium zinc oxide (IZO). The organic semiconductor layer 121 is formed on the substrate 101 and is disposed in the gap space of the source and drain electrodes 113 and 115. Further, the organic semiconductor layer 121 has end portions respectively overlapping the source and drain electrodes 113 and 115. The gate insulating layer 125 is formed on an organic semiconductor layer 121. Here, the organic gate insulating layer 125 includes an organic insulating material having a desirable contact property with the organic semiconductor layer 121, such as fluoropolymer, polyvinylalcohol (PVA), polyvinylpyridine (PVP). The organic gate insulating layer 125 has end portions respectively overlapping the source and drain electrodes 113 and 115.

A gate electrode 130 is formed on the gate insulating layer 125. The gate electrode 130, the gate insulating layer 125 and the organic semiconductor layer 121 have the same pattern as each other as shown in FIG. 3. That is, portions of the source and drain electrodes 113 and 115 that do not overlap with the gate electrode 130, the gate insulating layer 125 and the organic semiconductor layer are exposed from the gate electrode 130, the gate insulating layer 125 and the organic semiconductor layer.

A passivation layer 135 is formed on the source and drain electrodes 113 and 115 and the gate electrode 130 and has a gate contact hole 137 exposing a portion of the gate electrode 130 and an opening "OP" exposing a main region of the pixel electrode 118 corresponding to the pixel region "P." The passivation layer 135 includes a photosensitive material, such as polyvinylalcohol, photoacryl, or benzocyclobutene.

A gate line 146 is formed on the passivation layer 135 and is connected to the gate electrode 130 via the gate contact hole 137. Although not shown, the gate line 146 is formed to cross the data line 110 as shown in FIG. 2.

A buffer layer (not shown) may be formed over the entire surface of the substrate 101 before forming the source and drain electrodes 113 and 115 and the organic semiconductor layer 121 to improve contact property of the organic semiconductor layer 121, and a second passivation layer (not shown) may formed on the gate line 146 to prevent corrosion of the gate line 146.

Accordingly, the source and drain electrodes 113 and 115, the organic semiconductor layer 121 and the gate electrode 130 constitute the organic TFT "Tr."

Generally, a method of fabricating a TFT including an amorphous silicon includes forming a gate insulating layer with a thickness of about 4,500 Å. Similarly, when the method of fabricating the organic TFT includes forming a gate insulating layer 125 with the same thickness as that of the TFT including the amorphous silicon, actually, the electrical characteristics of the organic TFT are worse than that of the TFT including the amorphous silicon.

Table 1 shows a mobility, an S-factor, and an on/off ratio of each of samples 1 to 15. Further, a mean and standard deviation of the mobility, the S-factor, and the on/off ratio regarding all samples 1 to 15 are disclosed as follows:

TABLE 1

| [GI (t = 4,500 Å)] | | | |
| --- | --- | --- | --- |
| Sample | Mobility($cm^2$/V · sec) | S-factor | On/Off ratio |
| 1 | 0.10 | 3.20 | 1.88E+04 |
| 2 | 0.12 | 3.34 | 9.09E+04 |
| 3 | 0.13 | 1.6 | 1.94E+05 |
| 4 | 0.14 | 3.38 | 6.35E+04 |
| 5 | 0.12 | 3.02 | 6.67E+04 |
| 6 | 0.09 | 3.11 | 6.98E+04 |
| 7 | 0.24 | 1.50 | 1.18E+05 |
| 8 | 0.14 | 2.40 | 3.80E+04 |
| 9 | 0.14 | 2.41 | 4.68E+04 |
| 10 | 0.20 | 2.75 | 7.37E+04 |
| 11 | 0.14 | 2.34 | 6.42E+04 |
| 12 | 0.17 | 2.38 | 8.99E+04 |
| 13 | 0.31 | 2.49 | 1.54E+05 |
| 14 | 0.25 | 2.75 | 1.35E+05 |
| 15 | 0.17 | 2.19 | 1.05E+05 |
| Mean | 0.16 | 2.59 | 8.86E+04 |
| Standard deviation | 0.06 | 0.57 | 4.64E+04 |

Here, the samples 1 to 15 correspond to samples in different portions of the organic TFT with respect to one or plurality of substrates under the same process condition. Table shows electrical characteristics of the organic TFT "Tr" when the organic gate insulating layer 125 is formed on the organic semiconductor layer 121 with a thickness "t" of 4,500 Å.

As shown in the Table 1, the mobility shows a moving speed of an average carrier in the organic semiconductor layer 121, a sub-threshold swing (S-factor) shows switching ability of the organic semiconductor layer 121. More specifically, in a graph illustrating a drain current characteristics of the organic TFT with respect to the gate voltage, the S-factor shows a reciprocal value at a slope in an active region in which the value of the drain current is increased with respect to the applied gate voltage. The on/off ratio is obtained by ON current value divided by OFF current value. That is, the more the value of the mobility is increased and the value of the on/off ratio increases, the electrical characteristics of the organic TFT are considered better. In contrast, the more the S-factor increases, the electrical characteristics of the organic TFT are considered worse. In other words, the value of the S-factor is in inverse proportion to the value of the characteristics of the organic TFT.

Referring back to the Table 1, when the thickness "t" of the gate insulating layer is 4,500 Å, the mobility is 0.16 $cm^2$/V.sec, the S-factor is 2.59 and the on/off ratio is 8.86E+04. Accordingly, the mobility, the S-factor, and the on/off ratio of the organic TFT including the organic semiconductor material are substantially lower than that of the TFT including the amorphous silicon.

The organic gate insulating layer 125 for the organic TFT according to embodiments of the present invention has a thickness of about 1,800 Å to about 2,500 Å that can prevent a dielectric breakdown and improve the characteristics of the organic TFT. Hereinafter, Tables 2 to 6 are disclosed to show characteristics for the thickness of the gate insulating layer 125 at about 1,800 Å to about 2,500 Å. The mobility, the S-factor, and the on/off ratio of the gate insulating layer 125 having thicknesses of 3,000 Å, 2,500 Å, 2,000 Å, 1,800 Å, and 1,000 Å through the tables 2 to 6 is determined as follows:

TABLE 2

[GI (t = 3,000 Å)]

| Sample | Mobility($cm^2$/V · sec) | S-factor | On/Off ratio |
|---|---|---|---|
| 1 | 0.14 | 2.40 | 3.80E+04 |
| 2 | 0.14 | 2.41 | 4.68E+04 |
| 3 | 0.17 | 3.38 | 8.99E+04 |
| 4 | 0.17 | 2.19 | 1.05E+04 |
| Mean | 0.16 | 2.60 | 4.63E+04 |
| Standard deviation | 0.02 | 0.53 | 3.30E+04 |

TABLE 3

[GI (t = 2,500 Å)]

| Sample | Mobility($cm^2$/V · sec) | S-factor | On/Off ratio |
|---|---|---|---|
| 1 | 0.19 | 1.55 | 2.83E+05 |
| 2 | 0.13 | 2.41 | 1.78E+05 |
| 3 | 0.22 | 2.06 | 4.22E+05 |
| 4 | 0.17 | 2.25 | 2.95E+05 |
| 5 | 0.23 | 1.83 | 4.28E+05 |
| 6 | 0.23 | 1.83 | 2.45E+05 |
| 7 | 0.15 | 1.78 | 1.71E+05 |
| 8 | 0.27 | 1.95 | 6.13E+05 |
| 9 | 0.13 | 0.89 | 2.10E+05 |
| 10 | 0.19 | 1.44 | 3.96E+05 |
| 11 | 0.34 | 1.70 | 3.73E+05 |
| 12 | 0.16 | 1.54 | 2.15E+05 |
| 13 | 0.21 | 1.55 | 2.73E+05 |
| 14 | 0.14 | 1.53 | 3.20E+05 |
| 15 | 0.14 | 1.69 | 2.25E+05 |
| 16 | 0.30 | 1.45 | 6.66E+05 |
| 17 | 0.19 | 1.49 | 4.40E+05 |
| Mean | 0.20 | 1.7 | 3.38E+05 |
| Standard deviation | 0.06 | 0.35 | 1.43E+05 |

TABLE 4

[GI (t = 2,000 Å)]

| Sample | Mobility($cm^2$/V · sec) | S-factor | On/Off ratio |
|---|---|---|---|
| 1 | 0.19 | 1.55 | 2.83E+05 |
| 2 | 0.30 | 1.45 | 6.66E+05 |
| 3 | 0.19 | 1.49 | 4.40E+05 |
| 4 | 0.21 | 1.55 | 2.73E+05 |
| Mean | 0.22 | 1.51 | 4.15E+05 |
| Standard deviation | 0.05 | 0.05 | 1.84E+05 |

TABLE 5

[GI (t = 1,800 Å)]

| Sample | Mobility($cm^2$/V · sec) | S-factor | On/Off ratio |
|---|---|---|---|
| 1 | 0.17 | 1.68 | 4.80E+04 |
| 2 | 0.11 | 1.73 | 6.90E+04 |
| 3 | 0.22 | 1.36 | 2.42E+05 |
| 4 | 0.14 | 1.78 | 7.30E+04 |
| 5 | 0.26 | 1.14 | 2.15E+05 |
| 6 | 0.19 | 1.21 | 1.27E+05 |
| 7 | 0.24 | 1.53 | 1.90E+05 |
| 8 | 0.31 | 1.44 | 5.12E+04 |
| 9 | 0.24 | 0.41 | 1.17E+05 |
| 10 | 0.24 | 1.18 | 6.21E+04 |

TABLE 5-continued

[GI (t = 1,800 Å)]

| Sample | Mobility($cm^2$/V · sec) | S-factor | On/Off ratio |
|---|---|---|---|
| 11 | 0.16 | 1.24 | 1.18E+05 |
| 12 | 0.21 | 1.26 | 9.39E+04 |
| 13 | 0.13 | 1.21 | 6.43E+04 |
| 17 | 0.15 | 1.39 | 4.53E+04 |
| Mean | 0.20 | 1.40 | 1.08E+05 |
| Standard deviation | 0.06 | 0.21 | 6.47E+04 |

TABLE 6

[GI (t = 1,000 Å)]

| Sample | Mobility($cm^2$/V · sec) | S-factor | On/Off ratio |
|---|---|---|---|
| 1 | 0.19 | 1.21 | 1.27E+05 |
| 2 | 0.24 | 1.41 | 1.17E+05 |
| 3 | 0.16 | 1.24 | 1.18E+05 |
| 4 | 0.24 | 1.53 | 1.90E+05 |
| Mean | 0.21 | 1.35 | 1.38E+05 |
| Standard deviation | 0.04 | 0.15 | 0.35E+05 |

TABLE 7

[GI Mean(t = 4,500 Å/3,000 Å/2,500 Å/2,000 Å/1,800 Å/1,000 Å)]

| Thickness | Mobility($cm^2$/V · sec) | S-factor | On/Off ratio |
|---|---|---|---|
| 4,500 Å | 0.16 | 2.59 | 8.86E+04 |
| 3,000 Å | 0.16 | 2.60 | 4.63E+04 |
| 2,500 Å | 0.20 | 1.70 | 3.38E+05 |
| 2,000 Å | 0.22 | 1.51 | 4.15E+05 |
| 1,800 Å | 0.20 | 1.40 | 1.08E+05 |
| 1,000 Å | 0.20 | 0.35 | 1.38E+05 |

Here, the gate insulating layer 125 includes the organic insulating material, such as fluoropolymer, polyvinylalcohol (PVA) or polyvinylpyridine (PVP). Therefore, due to the characteristics of the organic insulating material, the thickness "t" of gate insulating layer being less than 1,000 Å, there is frequently a dielectric breakdown phenomenon and the life-span is reduced. On the other hand, when the thickness "t" of the gate insulating layer 125 is more than 2,500 Å, there is a problem in that the electrical characteristics of the organic TFT deteriorate.

Table 7 includes each mean value of the mobility, the S-factor, and the on/off ratio in the respective thicknesses of 4,500 Å/3,000 Å/2,500 Å/2,000 Å/1,800 Å/1,000 Å. Further, FIGS. 7 and 8 illustrate the range of the thickness of the gate insulating layer according embodiments of the present invention, FIG. 7 shows a mobility graph and a S-factor graph in connection with the Table 7, and FIG. 8 shows an on/off ratio graph in connection with the Table 7.

Figure 7:
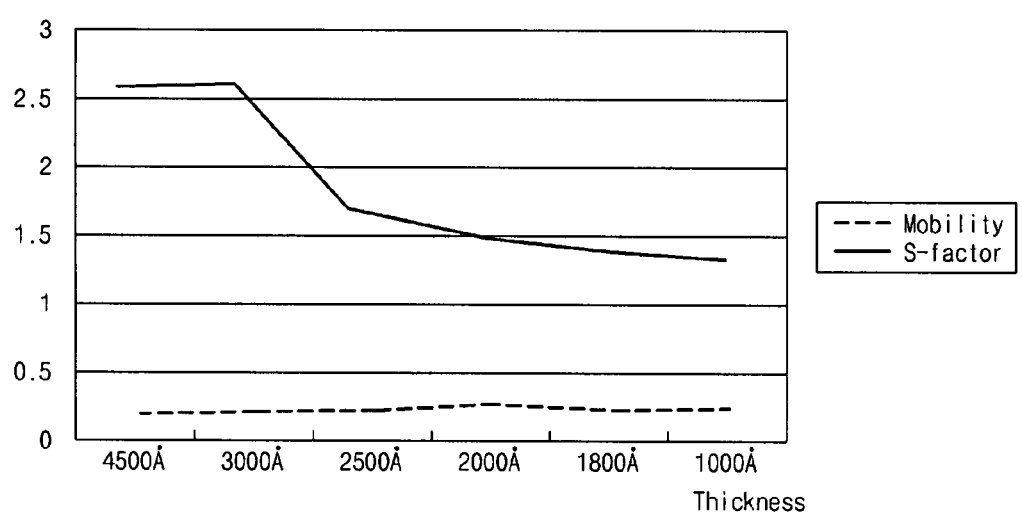
FIG. 7 is a view showing a mobility graph and an S-factor graph in connection with the Table 7 according to an embodiment of the present invention.
Figure 8:
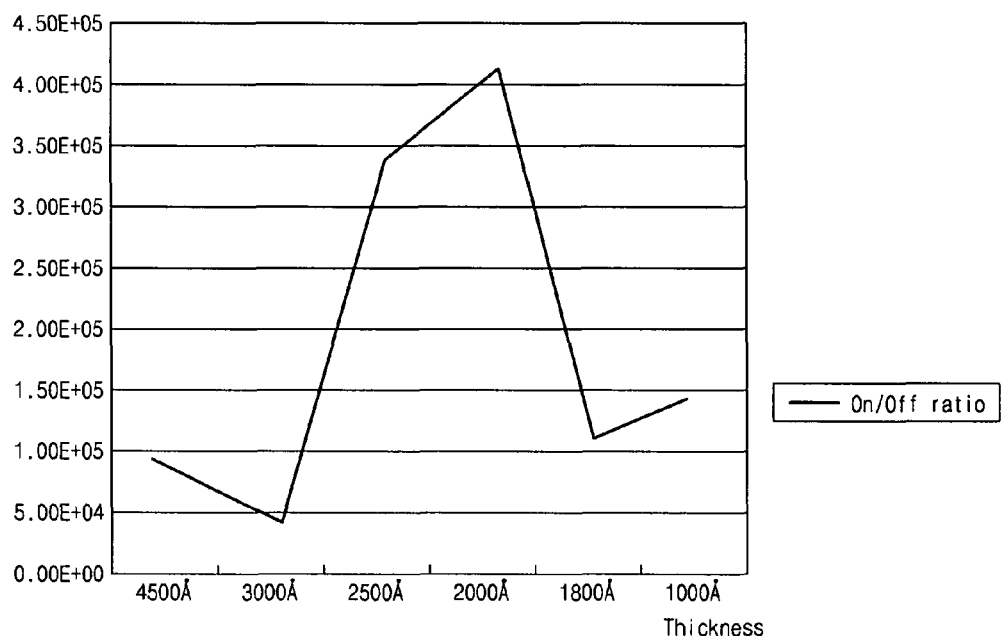
FIG. 8 is a view showing an on/off ratio graph in connection with the Table 7 according to an embodiment of the present invention.

In view of the characteristics of the gate insulating layer including the organic insulating layer and the Tables 1 to 7 and FIGS. 7 and 8, the range of the thickness "t" of the gate insulating layer 125 according to embodiments of the present invention is about 1,800 Å to about 2,500 Å. More specifically, the thickness of the gate insulating layer 125 should be about 2,000 Å to about 2,500 Å when consider all three of mobility, S-factor and on/off ratio.

Accordingly, the organic gate insulating layer having a thickness of about 1,800 Å to about 2,500 Å for the organic TFT according to embodiments of the present invention can have desirable mobility, the S-factor and the on/off ratio in comparison with that of the related art. Among the elements of the organic TFT, since only the thickness of gate insulating layer substantially affects the characteristics of the organic TFT, thicknesses of other elements of the organic TFT are not discussed.

Figure 4A:
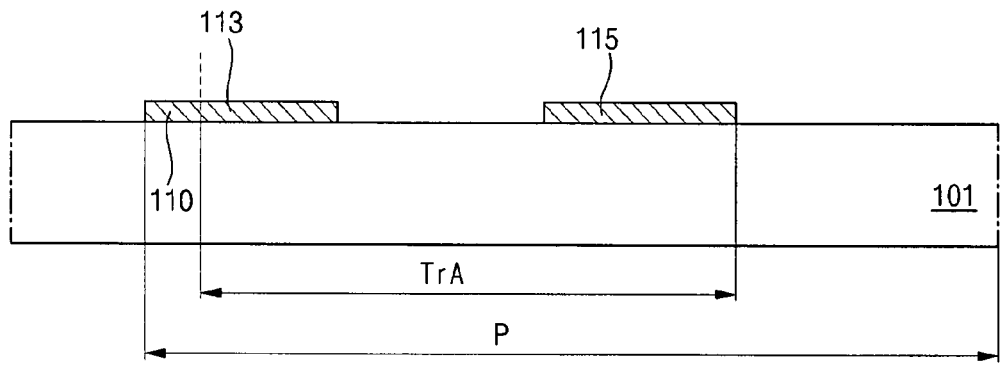
FIGS. 4A to 4F are cross-sectional views of an array substrate for an LCD including an organic TFT in accordance with the manufacturing process according to an embodiment of the present invention.

FIGS. 4A to 4F are cross-sectional views of an array substrate for an LCD including an organic TFT in accordance with the manufacturing process according to an embodiment of the present invention. As shown in FIG. 4A, a metal layer (not shown) is formed by depositing a metallic material having a low resistance, such as gold (Au), on a substrate 101. The metal layer is patterned into a data line 110, a source electrode 113 connected the data line 110, and a drain electrode 115 spaced apart from the source electrode 113 by a photolithography process including coating a photoresist on the metal layer to form a photoresist layer, exposing a portion of the photoresist layer using a mask, developing the exposed photoresist layer, and etching the metal layer exposed from the photoresist layer, and stripping the photoresist layer.

Figure 4B:
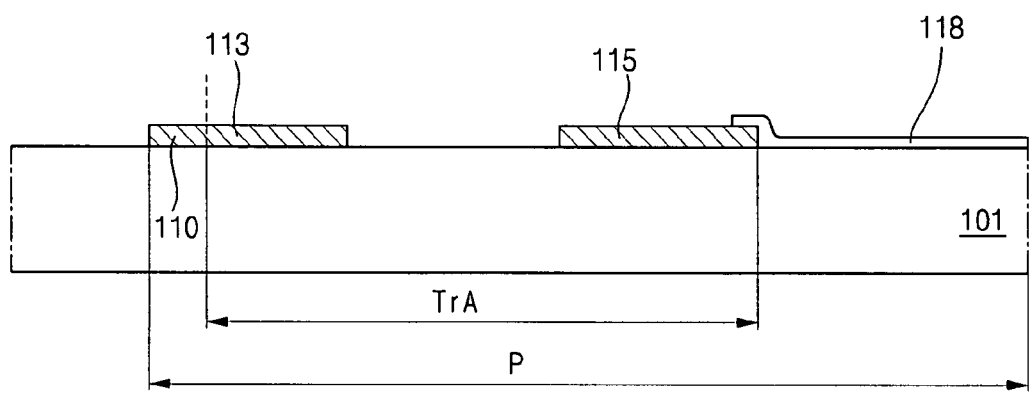

In FIG. 4B, a pixel electrode 118 is formed by depositing and patterning a transparent conductive material, such as ITO or IZO, using the photolithography to contact an end portion of the drain electrode 115 and is disposed in a pixel region "P."

Figure 4C:
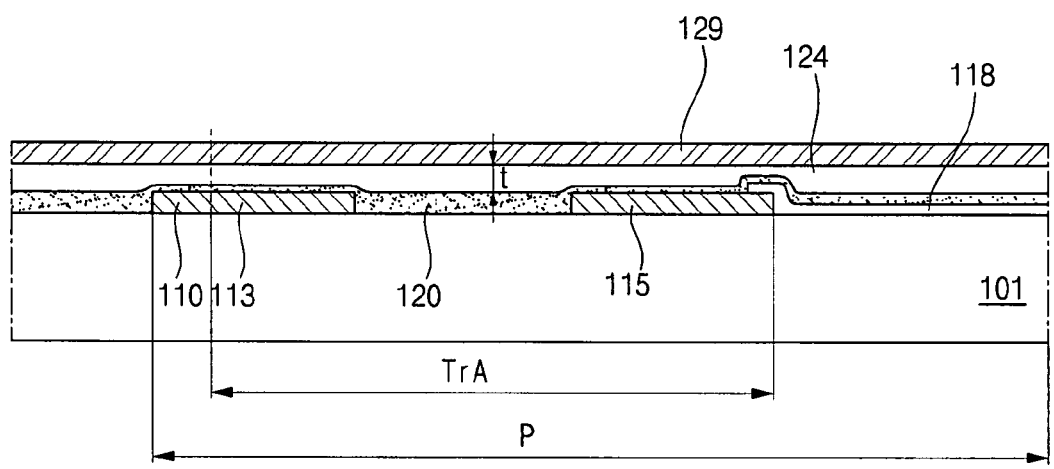

In FIG. 4C, an organic semiconductor material layer 120 is formed by coating an organic semiconductor material, such as pentaene, polythiophene, or P3HT (poly-3-hexythiophene) on the source electrode 113, the drain electrode 115, and the pixel electrode 118. For example, in the step of coating, coating the organic semiconductor material is performed using an ink-jet apparatus, a nozzle coating apparatus, a bar coating apparatus, a slit coating apparatus, a spin coating apparatus, and a printing apparatus.

Sequentially, a gate insulating material layer 124 is formed by coating an organic insulating material, such as fluoropolymer, polyvinylalcohol (PVA) or polyvinylpyridine (PVP), on the organic semiconductor material layer 120. Here, a thickness of the gate insulating material layer 124 is about 1,800 Å to about 2,500 Å. The gate insulating material layer 124 is then cured with light. The thickness "t" of the gate insulating material layer 124 may be determined after curing the gate insulating material layer 124. The thickness "t" is measured directly across the gate insulating layer 125 between the gate electrode 130 and the organic semiconductor layer 121, as shown in FIG. 4C.

Next, a second metal layer 129 is formed by depositing a metallic material that may be easily formed by dry etching, such as molybdenum (Mo) or chromium (Cr), on the gate insulating material layer 124.

Figure 4D:
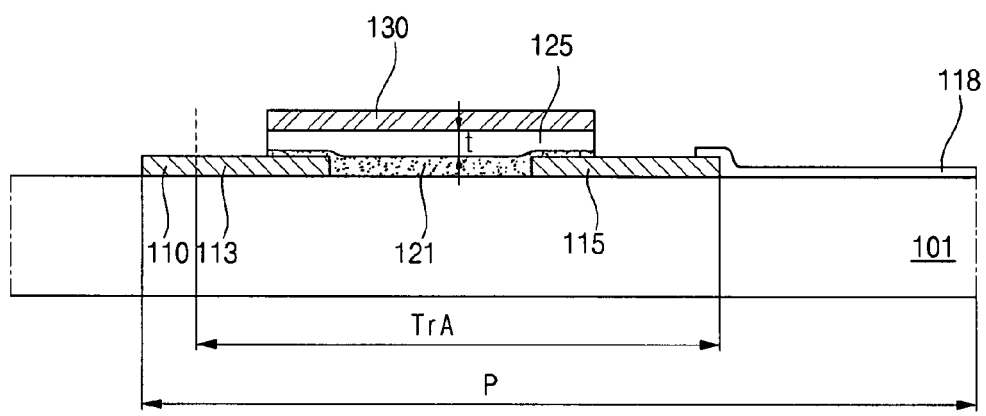

As shown in FIG. 4D, the second metal layer 129, the gate insulating material layer 124 and the organic semiconductor material layer 120 are simultaneously patterned by a photolithography using one mask. Although not shown, in the photolithography, a photoresist layer is formed by coating a photoresist on the second meal layer 129, a portion of the photoresist layer is exposed using the one mask, the exposed photoresist layer is developed to form a photoresist pattern, the second metal layer 129, the gate insulating material layer 124, and the organic semiconductor material layer 120 are simultaneously etched using the photoresist pattern as an etching mask by a dry etching method. After the etching step, the second metal layer 129, the gate insulating material layer 124, and the organic semiconductor material layer 120 are patterned into a gate electrode 130, a gate insulating layer 125 and an organic semiconductor layer 121, respectively. Accordingly, portions of the source and drain electrodes 113 and 115 that do not overlap with the gate electrode 130, the gate insulating layer 125 and the organic semiconductor layer 121 are exposed.

Figure 4E:
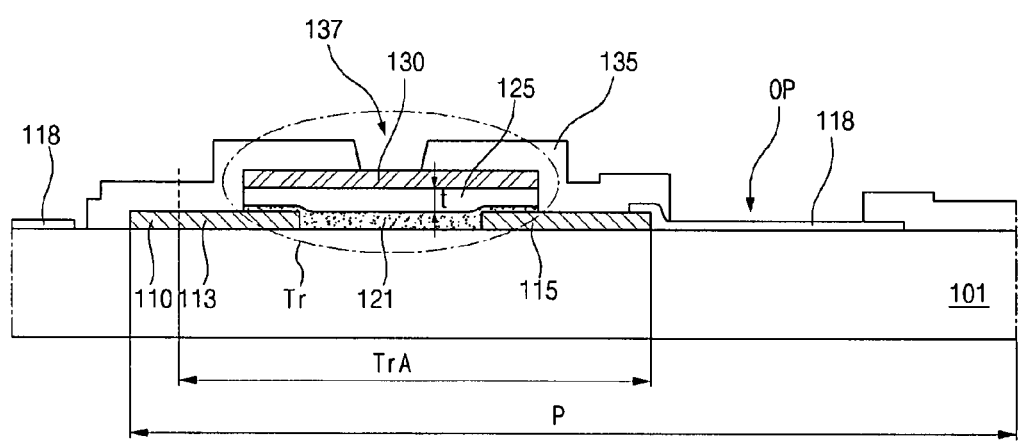

As shown in FIG. 4E, a passivation layer 135 is formed by coating and patterning an organic insulating material on the gate electrode 130 to have a gate contact hole 137 exposing a portion of the gate electrode 130 and an opening "OP" exposing a main region of the pixel electrode 118 in the pixel region "P."

Figure 4F:
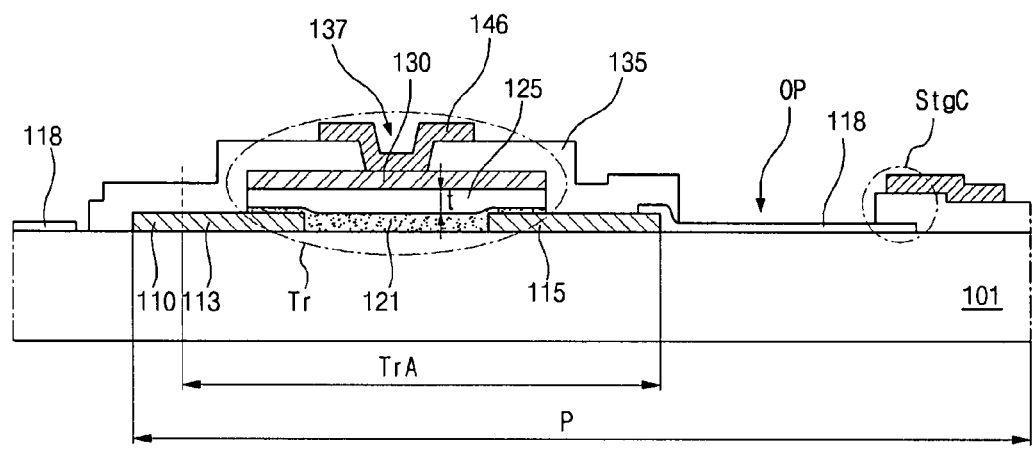

In FIG. 4F, a gate line 146 is formed by depositing and patterning a metallic material having a low resistance, such as gold (Au), on the passivation layer 135. The gate line 146 is connected to the gate electrode 130 via the gate contact hole 137. Although not shown, the gate line 146 crosses the data line 110 to define the pixel region "P." Further, the gate line 146 overlaps with an end portion of the pixel electrode 118. The overlapped portions of the gate line 146 and the pixel electrode 118 and the passivation layer 135 therebetween constitute a storage capacitor "StgC."

Although not shown, a second passivation layer may be formed on the gate line 146 to protect the gate line 146 from an external impact and includes an organic insulating material, such as polyvinylalcohol (PVA), photoacryl, or benzocyclobutene (BCB). The gate insulating layer having a specific thickness in a range according to the present invention can be applied to a bottom-gate type organic TFT as well as the above-mentioned top-gate type organic TFT. Hereinafter, it will be explained with regard to structural features of the bottom-gate type organic TFT.

Figure 5:
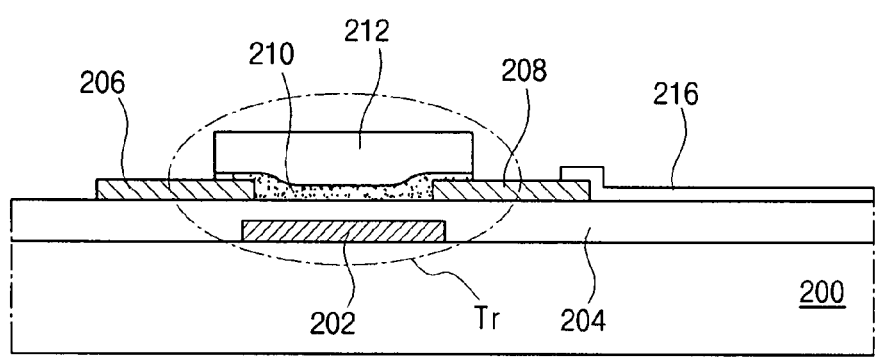
FIG. 5 is a schematic cross-sectional view of an array substrate for an LCD including a bottom-gate type organic TFT according to an embodiment of the present invention.

FIG. 5 is a schematic cross-sectional view of an array substrate for an LCD including a bottom-gate type organic TFT according to an embodiment of the present invention. As shown in FIG. 5, a gate electrode 202 is formed on a substrate 200, a gate insulating layer 204 having a predetermined thickness on the gate electrode 202, and source and drain electrodes 206 and 208, which are spaced apart from each other, are formed on the gate insulating layer 204. Here, a gap space (not shown) between the source and drain electrodes 206 and 208 corresponds to a central portion of the gate electrode 202. An organic semiconductor layer 210 and a passivation layer 212 are sequentially formed on the gate insulating layer 204 in the gap space between the source and drain electrodes 206 and 208. Accordingly, both end portions of the organic semiconductor layer 210 overlap respective end portions of the source and drain electrodes 206 and 208.

The gate electrode 202, the source and drain electrodes 206 and 208, and the organic semiconductor layer 210 constitute an organic TFT "Tr." That is, according to the embodiment, the organic semiconductor layer 210 is formed on the source and drain electrodes 206 and 208 because the source and drain electrodes 206 and 208 are formed before forming the organic semiconductor layer 210. The predetermined thickness of the gate insulating layer 204 is about 1,800 Å to about 2,500 Å. Another passivation layer may be formed over the entire surface except for the portion of the pixel electrode 216.

Figure 6:
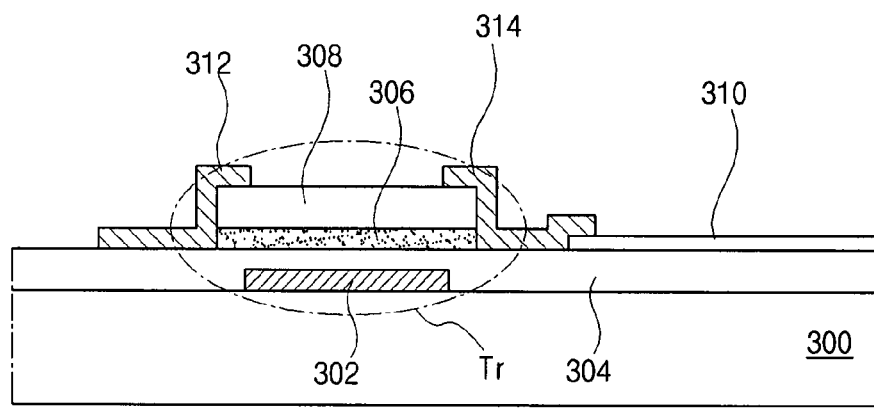
FIG. 6 is a schematic cross-sectional view of an array substrate of an LCD including a bottom-gate type organic TFT according to another embodiment of the present invention.

FIG. 6 is a schematic cross-sectional view of an array substrate of an LCD including a bottom-gate type organic TFT according to an embodiment of the present invention. As shown in FIG. 6, a gate electrode 302 is formed on a substrate 300, a gate insulating layer 304 having a predetermined thickness is formed on the gate electrode 302, an organic semiconductor layer 306 and a passivation layer 308 are sequentially formed on the gate insulating layer 304 over the gate electrode 302. Here, the organic semiconductor layer 306 and the passivation layer 308 have the same pattern as each other. A pixel electrode 310 is formed on the gate insulating layer 304 to be spaced apart from the organic semiconductor layer 306 and the passivation layer 308. Further, source electrode 312 and drain electrode 314 are formed on a top surface of the passivation layer 308 and on both sides of the passivation layer 308 and the organic semiconductor layer 306 as well as on a top surface of the gate insulating layer 304. Accordingly, end surfaces of the organic semiconductor layer 306 respectively contact the source electrode 312 and the drain electrode 314. In addition, an end portion of the drain electrode that is disposed on the gate insulating layer is overlapped with an end portion of the pixel electrode 310 to be connected to the pixel electrode 310.

The gate electrode 302, the organic semiconductor layer 306, and the source and drain electrodes 312 and 314 constitute an organic TFT "Tr."

As explained above, according to the embodiment, the source and drain electrodes 312 and 314 are formed on the passivation layer 308 and the organic semiconductor layer 306 because the source and drain electrodes 312 and 314 are formed after the organic semiconductor layer 306 and the passivation layer 308 are formed on the gate insulating layer 304. Another passivation layer may be formed over the entire surface except for the portion of the pixel electrode 310.

The predetermined thickness of the gate insulating layer 304 can be selected from a range of about 1,800 Å to about 2,500 Å as suggested in the previous embodiments. Further, the materials consisting of the bottom-gate type organic TFT can be applied to that of the top-gate type organic TFT.

According to the array substrate for the LCD including the organic TFT having the gate insulating layer of the predetermined thickness and the method of fabricating the same, the dielectric breakdown can be solved and the characteristics of the organic TFT can be improved. Consequently, the electrical characteristics of the organic TFT, such as mobility, S-factor, and on/off ratio, can be improved.

It will be apparent to those skilled in the art that various modifications and variations can be made in the LCD device in embodiments of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device including an organic thin film transistor, comprising:
a data line on an upper surface of a substrate along a first direction, a source electrode connected to the data line, and a drain electrode spaced apart from the source electrode on the upper surface of the substrate;
an organic semiconductor layer on the upper surface of the substrate between the source and drain electrodes;
a gate insulating layer of a single layer on an upper surface of the organic semiconductor layer, the gate insulating layer including an organic insulating material, wherein the organic insulating material includes polyvinylpyridine;
a gate electrode on an upper surface of the gate insulating layer, wherein the gate insulating layer has a thickness of about 2,000 Å to about 2,500 Å between the organic semiconductor layer and the gate electrode, wherein a thickness of the gate insulating layer between the source and drain electrodes is thicker than that of the gate insulating layer overlapping the source and drain electrodes, wherein the gate electrode, the gate insulating layer and the organic semiconductor layer have a same shape and a same area as each other such that the gate electrode, the gate insulating layer and the organic semiconductor layer completely overlap each other;
a pixel electrode on the substrate, an end of the pixel electrode contacting a top surface and a side surface of the drain electrode;
a passivation layer on the gate electrode, the passivation layer having a contact hole that exposes a portion of the gate electrode and an opening exposing the pixel electrode, wherein the passivation layer covers the end of the pixel electrode; and
a gate line on the passivation layer along a second direction crossing the first direction, the gate line connected to the gate electrode via the contact hole.

2. The array substrate according to claim 1, further comprising a second passivation layer on the gate line.

3. The array substrate according to claim 1, wherein the organic semiconductor layer has end portions respectively overlapping the source and drain electrodes to be disposed on upper surfaces of the source and drain electrodes, and wherein the end portions of the organic semiconductor layer are thinner than portions of the organic semiconductor layer between the source and drain electrodes.

4. The array substrate according to claim 1, wherein the top surface of the gate insulating layer is substantially planar and parallel to the upper surface of the substrate.

* * * * *